United States Patent [19]

Wu et al.

[11] Patent Number: 5,237,190
[45] Date of Patent: Aug. 17, 1993

[54] CHARGE-COUPLED-DEVICE COLOR IMAGE SENSOR

[75] Inventors: Liang-Chung Wu; Clarence Choi, both of Hsin-Chu City, Taiwan

[73] Assignee: Hualon Microelectronics Corporation, Hsin-Chu City, Taiwan

[21] Appl. No.: 923,259

[22] Filed: Jul. 31, 1992

[51] Int. Cl.$^5$ .................. H01L 29/78; H01L 27/14; H01L 31/00
[52] U.S. Cl. ............................ 257/234; 257/233
[58] Field of Search .......... 357/24 LR, 24, 30 H, 357/29; 358/213.23, 213.26, 213.28, 213.29, 213.31; 377/61, 62, 63; 257/233, 234

[56] References Cited

U.S. PATENT DOCUMENTS

| | | | |
|---|---|---|---|
| 4,336,556 | 6/1982 | Sekine et al. | 357/24 LR |
| 4,744,057 | 5/1988 | Descure et al. | 357/24 LR |
| 4,928,158 | 5/1990 | Kimata | 357/24 LR |

FOREIGN PATENT DOCUMENTS

| | | | |
|---|---|---|---|
| 56-142682 | 11/1981 | Japan | 357/24 LR |
| 59-99764 | 6/1984 | Japan | 357/24 LR |
| 62-160758 | 7/1987 | Japan | 357/24 LR |

Primary Examiner—Andrew J. James
Assistant Examiner—Ngan Van Ngo
Attorney, Agent, or Firm—Charles E. Pfund

[57] ABSTRACT

A charge-coupled-device image sensor includes first, second and third linear array imagers, first, second and third horizontal charge-coupled-devices, first, second and third transfer gates and first and second vertically arranged charge-coupled-devices. The first transfer gate is operated so as to transfer electrons from the first linear array imager to the first horizontal charge-coupled-device. The third transfer gate, the first and second vertically arranged charge-coupled-devices and the second horizontal charge-coupled-device are operated so as to transfer electrons from the third linear array imager to the third horizontal charge-coupled-device. The second and third transfer gates and the first vertically arranged charge-coupled-device are operated after electrons from the third linear array imager have been transferred to the third horizontal charge-coupled-device so as to transfer electrons from the second linear array imager to the second horizontal charge-coupled-device.

3 Claims, 4 Drawing Sheets

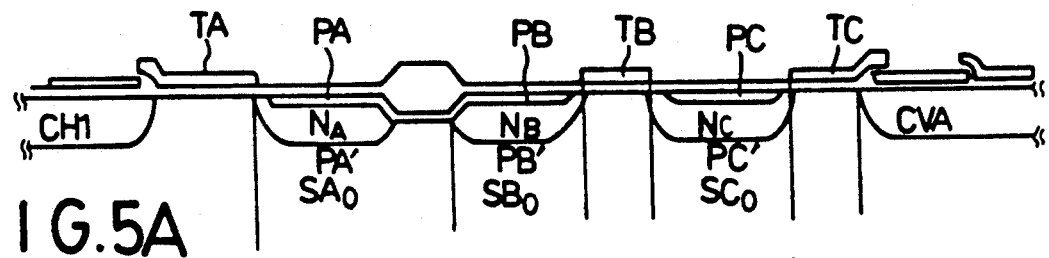
FIG. 5A
TB:OFF
TC:OFF
FIG. 5B
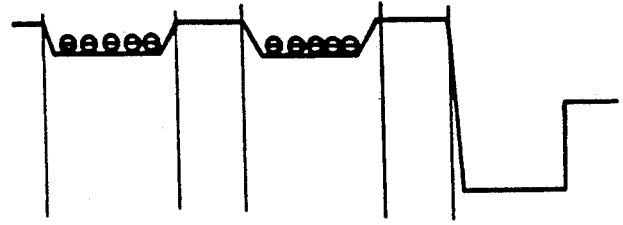
TB:OFF
TC:ON
FIG. 5C
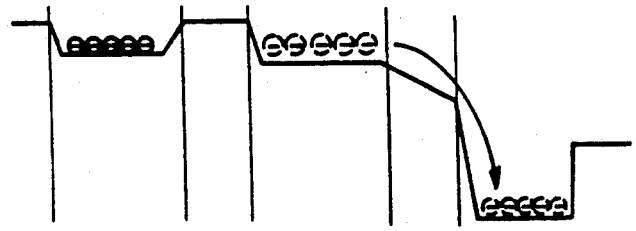
TB:OFF
TC:OFF
FIG. 5D
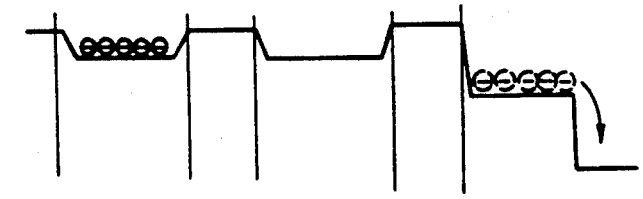
TB:ON
TC:ON
FIG. 5E
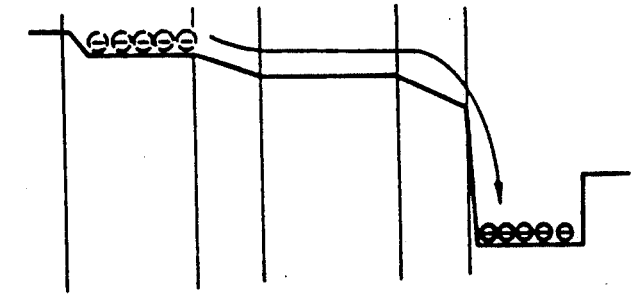

CHARGE-COUPLED-DEVICE COLOR IMAGE SENSOR

BACKGROUND OF THE INVENTION

1. Field of the Invention

The invention relates to a charge-coupled-device image sensor, more particularly to a charge-coupled-device color image sensor which has a high sensing efficiency and which permits reductions in the software processing time, in the hardware cost and in the area occupied thereby on a semiconductor substrate.

2. Description of the Related Art

Referring to FIG. 1, a first example of a conventional charge-coupled-device color image sensor (CCDIS) is shown to comprise three linear array imagers (SA, SB, SC). Each of the linear array imagers (SA, SB, SC) comprises a plurality of photodetectors and corresponds to one of the colors red, blue and green. A charge packet of electrons is collected from each of the photodetectors, which charge packet has an amount that is directly proportional to the incident radiation at the respective photodetector. The charge packets are received at a respective output port (011, 012, 021, 022, 031, 032) via one of the transfer gates (T1, T2, T3) and one of the horizontal CCDs (C11, C12, C21, C22, C31, C32).

Note that a delay in the transmission of data occurs when an image is scanned because of the relatively large space between two adjacent linear array imagers. One frame of image data can be obtained only after collating data from the three linear array imagers. Therefore, a memory unit is required so as to store temporarily the data from each of the linear array imagers and to permit access of said data so as to complete one image data frame. The above described conventional CCDIS makes inefficient use of memory space and requires a relatively long software processing time. Note also that the area occupied by the CCDIS on a semiconductor substrate is relatively large.

A second example of a conventional CCDIS is shown in FIG. 2 to include two linear array imagers (SA1, SB1) which are arranged side by side with each other. A horizontal CCD (C2) spaces a third linear array imager (SC1) from the linear array imagers (SA1, SB1). The conventional CCDIS shown in FIG. 2 can overcome most of the drawbacks of the conventional CCDIS shown in FIG. 1. The sensing efficiency of the second conventional CCDIS, however, is relatively poor.

A third example of a conventional CCDIS is shown in FIG. 3 to comprise a plurality of photodetectors (S11, S12, S21, S22) which generate a respective charge packet of electrons that corresponds to the incident radiation thereat. Transfer gates (T11, T12) permit the transfer of charge packets from the photodetectors to vertically arranged CCDs (CV1, CV2). Data from the vertically arranged CCDs (CV1, CV2) are received by a horizontal CCD (CH) for reception at an output port (O). Note that in the above described CCDIS construction, the space between two adjacent photodetectors is approximately equal to one picture element due to the incorporation of a plurality of horizontal and vertically arranged CCDs, thereby resulting in a relatively low sensing efficiency (typically less than 50%).

SUMMARY OF THE INVENTION

Therefore, the objective of the present invention is to provide a charge-coupled-device color image sensor which has a high sensing efficiency and which permits reductions in the software processing time so as to achieve a high system efficiency.

Another objective of the present invention is to provide a charge-coupled-device color image sensor which permits reductions in the hardware cost and in the area occupied thereby on a semiconductor substrate.

Accordingly, the preferred embodiment of a charge-coupled-device image sensor of the present invention comprises:

a first linear array imager means for generating a first charge packet of electrons corresponding to the incident radiation thereat;

a first horizontal charge-coupled-device disposed adjacent to and extending along one side of the first linear array imager means;

a first transfer gate means disposed between the first linear array imager means and the first horizontal charge-coupled-device and operable so as to transfer the first charge packet from the first linear array imager means to the first horizontal charge-coupled-device;

a second linear array imager means for generating a second charge packet of electrons corresponding to the incident radiation thereat, said second linear array imager means being electrically isolated from and being disposed adjacent to and extending along the other side of the first linear array imager means;

a third linear array imager means disposed adjacent to and extending along one side of the second linear array imager means opposite to the first linear array imager means, said third linear array imager means generating a third charge packet of electrons corresponding to the incident radiation thereat;

a second transfer gate means disposed between the second and third linear array imager means and operable so as to transfer the second charge packet from the second linear array imager means to the third linear array imager means;

a first vertically arranged charge-coupled-device disposed adjacent to and extending along one side of the third linear array imager means opposite to the second linear array imager means;

a third transfer gate means disposed between the third linear array imager means and the first vertically arranged charge-coupled-device and operable so as to transfer the second and third charge packets from the third linear array imager means to the first vertically arranged charge-coupled-device;

a second horizontal charge-coupled-device disposed adjacent to and extending along one side of the first vertically arranged charge-coupled-device opposite to the third linear array imager means and operable so as to receive the second and third charge packets from the first vertically arranged charge-coupled-device;

a second vertically arranged charge-coupled-device disposed adjacent to and extending along one side of the second horizontal charge-coupled-device opposite to the first vertically arranged charge-coupled-device and operable so as to receive the third charge packet from the second horizontal charge-coupled-device; and a third horizontal charge-coupled-device disposed adjacent to and extending along one side of the second vertically arranged charge-coupled-device opposite to the second horizontal charge-coupled-device and receiving the third charge packet from the second vertically arranged charge-coupled-device.

The third transfer gate means, the first vertically arranged charge-coupled-device, the second horizontal charge-coupled-device and the second vertically arranged charge-coupled-device are operated so as to transfer the third charge packet from the third linear array imager means to the third horizontal charge-coupled-device. The second and third transfer gate means and the first vertically arranged charge-coupled-device are operated after the third charge packet from the third linear array imager means has been transferred to the third horizontal charge-coupled-device so as to transfer the second charge packet from the second linear array imager means to the second horizontal charge-coupled-device.

BRIEF DESCRIPTION OF THE DRAWINGS

Other features and advantages of the present invention will become apparent in the following detailed description of the preferred embodiment, with reference to the accompanying drawings, of which:

FIG. 5A is a V—V section of FIG. 4;

FIGS. 5B to 5E are potential diagrams of the preferred embodiment during different operating stages.

DETAILED DESCRIPTION OF THE PREFERRED EMBODIMENT

Figure 1:
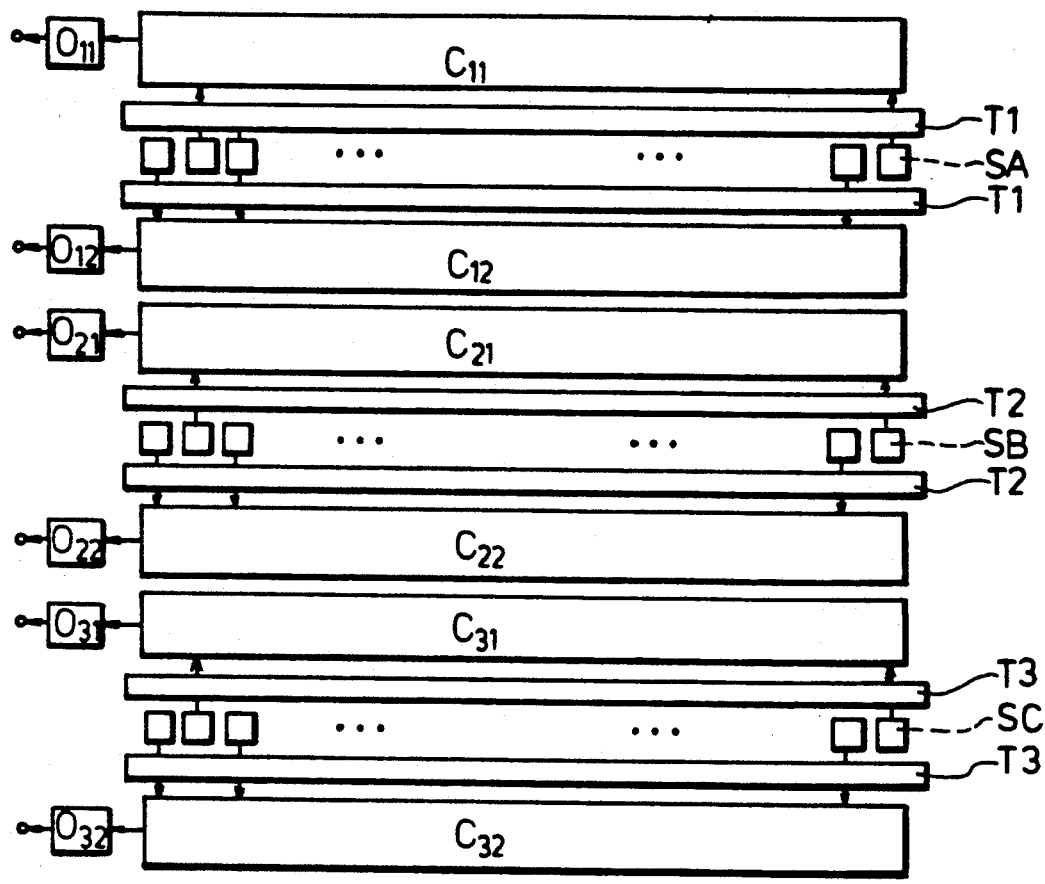
FIG. 1 is a composition diagram of a first example of a conventional charge-coupled-device color image sensor.
Figure 2:
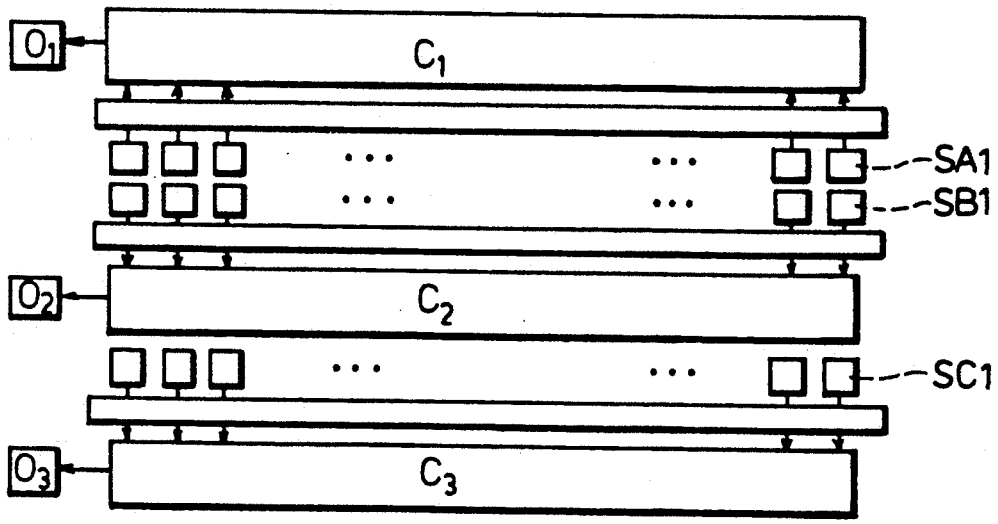
FIG. 2 is a composition diagram of a second example of a conventional charge-coupled-device color image sensor.
Figure 3:
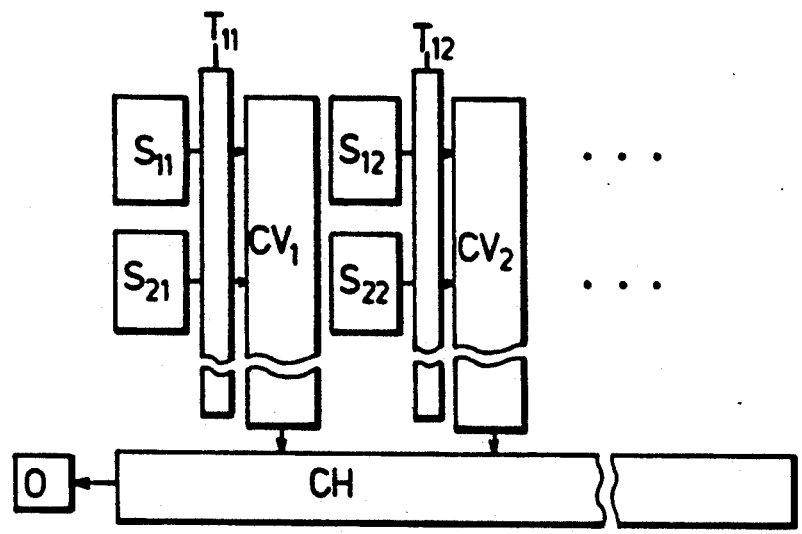
FIG. 3 is a composition diagram of a third example of a conventional charge-coupled-device color image sensor.
Figure 4:
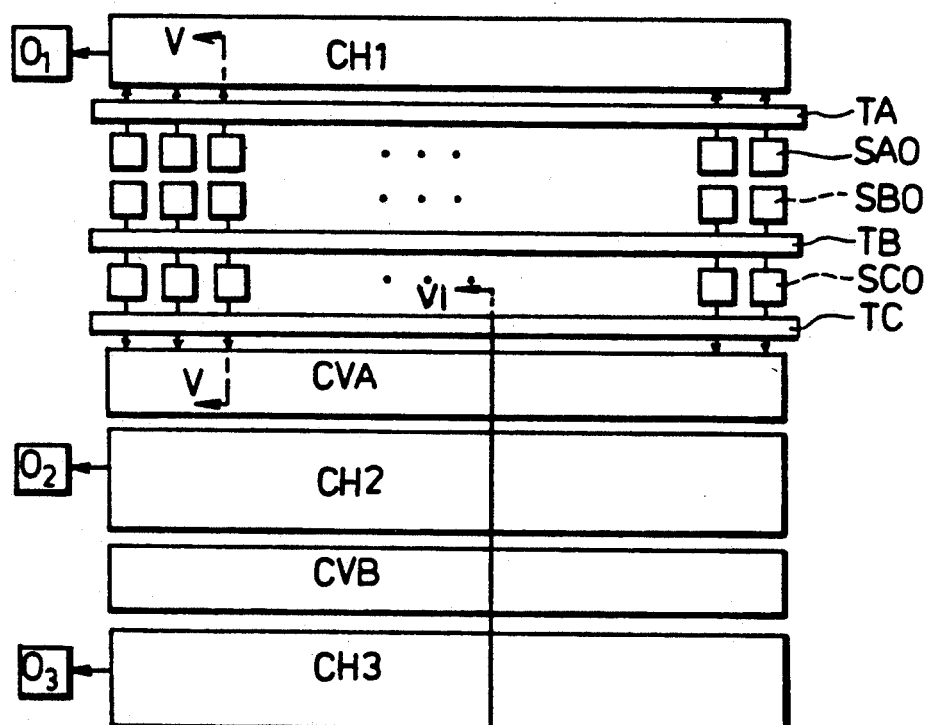
FIG. 4 is a composition diagram of the preferred embodiment of a charge-coupled-device color image sensor according to the present invention.

Referring to FIG. 4, the preferred embodiment of a charge-coupled-device color image sensor (CCDIS) according to the present invention is shown to comprise a first linear array imager (SA0), a second linear array imager (SB0), a third linear array imager (SC0), a first transfer gate (TA), a second transfer gate (TB), a third transfer gate (TC), a first horizontal CCD (CH1), a second horizontal CCD (CH2), a third horizontal CCD (CH3), a first vertically arranged CCD (CVA) and a second vertically arranged CCD (CVB).

The first and second linear array imagers (SA0, SB0) are isolated electrically and are arranged side by side with one another. The second and third linear array imagers (SB0, SC0) are spaced apart by the second transfer gate (TB). The first transfer gate (TA) is provided between the first linear array imager (SA0) and the first horizontal CCD (CH1). The first horizontal CCD (CH1) has an output port (01). The third linear array imager (SC0) is provided on one side of the third transfer gate (TC). The first vertically arranged CCD (CVA) is provided on the other side of the third transfer gate (TC). The second horizontal CCD (CH2) is provided between the first and second vertically arranged CCDs (CVA, CVB). The third horizontal CCD (CH3) is disposed on one side of the second vertically arranged CCD (CVB) opposite to the second horizontal CCD (CH2). The second and third horizontal CCDs (CH2, CH3) have respective output ports (02, 03).

Note that in the preferred embodiment, the horizontal CCDs (CH1, CH2, CH3) are not provided between the linear array imagers (SA0, SB0, SC0). The linear array imagers (SA0, SB0, SC0) are therefore disposed as close as possible so as to ensure a high sensing efficiency. A potential is applied at the first transfer gate (TA) so as to permit the flow of charge packets of electrons from the first linear array imager (SA0) to the first horizontal CCD (CH1). The first horizontal CCD (CH1) serially outputs the received charge packets at the output port (01). A potential is applied at the third transfer gate (TC) to permit the flow of charge packets of electrons from the third linear array imager (SC0) to the first vertically arranged CCD (CVA), the second horizontal CCD (CH2), the second vertically arranged CCD (CVB) and to the third horizontal CCD (CH3). The third horizontal CCD (CH3) serially outputs the received charge packets at the output port (03). After the charge packets which were previously collected in the third linear array imager (SC0) have been transferred therefrom, a potential is then applied at the second transfer gate (TB) so as to permit the flow of charge packets of electrons from the second linear array imager (SB0) to the third linear array imager (SC0), the third transfer gate (TC) and to the first vertically arranged CCD (CVA) for reception by the second horizontal CCD (CH2). The second horizontal CCD (CH2) serially outputs the received charge packets at the output port (02).

Figure 6:
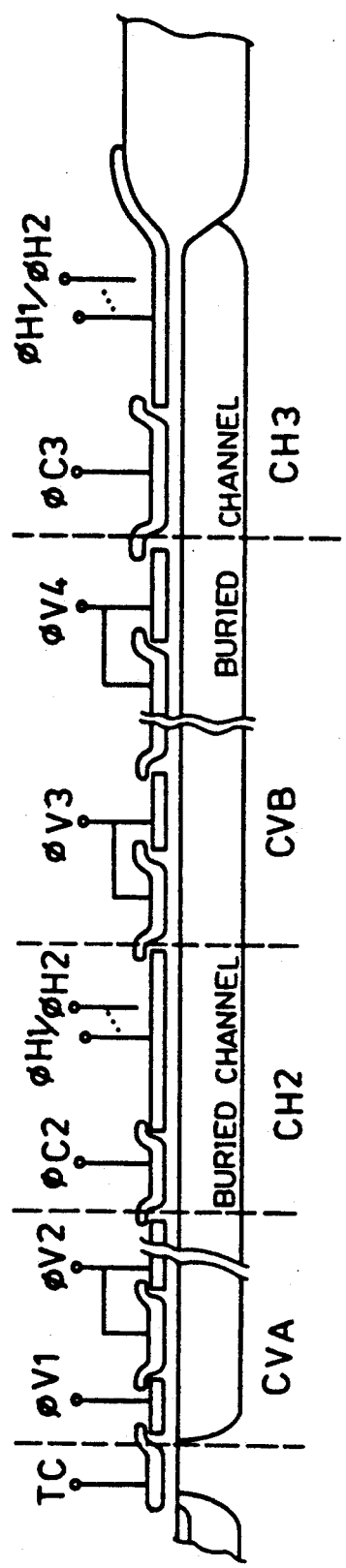
FIG. 6 is a VI—VI section of FIG. 4.

Note that the main feature of the present invention resides in that the charge packets from the second linear array imager (SB0) pass through the third linear array imager (SC0) before being received by the second horizontal CCD (CH2). Control of the operation of the horizontal and vertically arranged CCDs is achieved by a read-out circuitry connected to the preferred embodiment. The construction of the horizontal and vertically arranged CCDs, as shown in FIG. 6, and the procedure for controlling the operation of the same are known in the art and will not be detailed herein. The operation of the preferred embodiment is discussed in greater detail in the succeeding paragraphs.

Referring to FIG. 5A, the linear array imagers (SA0, SB0, SC0) are PNP semiconductor devices and respectively include an n-type semiconductor region (NA, NB, NC) in a P-type substrate (PA', PB', PC') at a major surface of the latter. A p-type semiconductor region (PA, PB, PC) is within a portion of the n-type semiconductor region (NA, NB, NC) at the major surface of the substrate (PA', PB', PC'). The linear array imagers (SA0, SB0, SC0) are capable of being completely depleted and have a positive potential between the p-type and n-type semiconductor regions thereof when depleted.

The semiconductor region (PB) of the linear array imager (SB0) is doped with a greater concentration of P-type impurities as compared to that of the semiconductor region (PC) of the linear array imager (SC0). The semiconductor region (PB) therefore requires two doping steps, while the semiconductor region (PC) undergoes only one doping step. Thus, the positive potential between the p-type and n-type semiconductor regions of the linear array imager (SB0) is greater than that of the linear array imager (SC0) when the linear array imagers (SB0, SC0) are completely depleted.

Charge packets are created in the linear array imagers (SA0, SB0, SC0), which charge packets have an amount that is directly proportional to the incident radiation threat [only the charge packets in the linear array imagers (SB0, SC0) are shown in FIG. 5B]. The transfer of charge packets from the linear array imager (SA0) to the first horizontal CCD (CH1) is achieved in a conventional manner. That is, the read-out circuitry generates a potential at the first transfer gate (TA) to permit the reading of the charge packets into the first horizontal CCD (CH1).

Referring to FIG. 5C, a potential is applied to the third transfer gate (TC) so as to lower the potential barrier between the linear array imager (SC0) and the first vertically arranged CCD (CVA) in order to permit the transfer of the charge packets from the linear array imager (SC0) to the first vertically arranged CCD (CVA). Referring to FIG. 5D, the applied potential is then removed so as to raise the potential barrier after the charge packets from the linear array imager (SC0) have been transferred to the first vertically arranged CCD (CVA).

Referring to FIG. 5E, after the charge packets from the linear array imager (SC0) have been read into the third horizontal CCD (CH3), a potential is applied to the second and third transfer gates (TB, TC) so as to lower the potential barrier between the linear array imagers (NB, NC) and the potential barrier between the linear array imager (SC0) and the first vertically arranged CCD (CVA), thereby permitting the transfer of the charge packets from the linear array imager (SC0) to the first vertically arranged CCD (CVA) so as to be read into the third horizontal CCD (CH3).

It has thus been shown that the charge-coupled-device color image sensor of the present invention provides a high sensing efficiency and requires a shorter software processing time so as to achieve high system efficiency. The preferred embodiment also entails a lower hardware cost and occupies a smaller area on a semiconductor substrate.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A charge-coupled-device image sensor, comprising:

a first linear array imager means for generating a first charge packet of electrons corresponding to the incident radiation thereat;

a first horizontal charge-coupled-device disposed adjacent to and extending along one side of said first linear array imager means;

a first transfer gate means disposed between said first linear array imager means and said first horizontal charge-coupled-device and operable so as to transfer said first charge packet from said first linear array imager means to said first horizontal charge-coupled-device;

a second linear array imager means for generating a second charge packet of electrons corresponding to the incident radiation thereat, said second linear array imager means being electrically isolated from and being disposed adjacent to and extending along the other side of said first linear array imager means;

a third linear array imager means disposed adjacent to and extending along one side of said second linear array imager means opposite to said first linear array imager means, said third linear array imager means generating a third charge packet of electrons corresponding to the incident radiation thereat;

a second transfer gate means disposed between said second and third linear array imager means and operable so as to transfer said second charge packet from said second linear array imager means to said third linear array imager means;

a first vertically arranged charge-coupled-device disposed adjacent to and extending along one side of said third linear array imager means opposite to said second linear array imager means;

a third transfer gate means disposed between said third linear array imager means and said first vertically arranged charge-coupled-device and operable so as to transfer said second and third charge packets from said third linear array imager means to said first vertically arranged charge-coupled-device;

a second horizontal charge-coupled-device disposed adjacent to and extending along one side of said first vertically arranged charge-coupled-device opposite to said third linear array imager means and operable so as to receive said second and third charge packets from said first vertically arranged charge-coupled-device;

a second vertically arranged charge-coupled-device disposed adjacent to and extending along one side of said second horizontal charge-coupled-device opposite to said first vertically arranged charge-coupled-device and operable so as to receive said third charge packet from said second horizontal charge-coupled-device; and a third horizontal charge-coupled-device disposed adjacent to and extending along one side of said second vertically arranged charge-coupled-device opposite to said second horizontal charge-coupled-device and receiving said third charge packet from said second vertically arranged charge-coupled-device;

said third transfer gate means, said first vertically arranged charge-coupled-device, said second horizontal charge-coupled-device and said second vertically arranged charge-coupled-device being operated so as to transfer said third charge packet from said third linear array imager means to said third horizontal charge-coupled-device;

said second and third transfer gate means and said first vertically arranged charge-coupled-device being operated after said third charge packet from said third linear array imager means has been transferred to said third horizontal charge-coupled-device so as to transfer said second charge packet from said second linear array imager means to said second horizontal charge-coupled-device.

2. The charge-coupled-device image sensor as claimed in claim 1, wherein:

said first, second and third linear array imagers are semiconductor devices and respectively include a semiconductor substrate of a first conductivity type, a first semiconductor region of a second conductivity type provided on said semiconductor substrate at a major surface of said semiconductor substrate, and a second semiconductor region of the first conductivity type and provided within a portion of said first semiconductor region at the major surface of said semiconductor substrate;

said second semiconductor region of said second linear array imager means being doped with a greater concentration of impurities of the first conductivity type as compared to that of said second semiconductor region of said third linear array imager means.

3. The charge-coupled-device imager sensor as claimed in claim 2, wherein said first and second conductivity types are p-type and n-type, respectively.

* * * * *